(12) United States Patent
Liang et al.

(10) Patent No.: US 9,711,534 B2
(45) Date of Patent: Jul. 18, 2017

(54) DEVICES INCLUDING A DIAMOND LAYER

(75) Inventors: Di Liang, Santa Barbara, CA (US); Raymond G Beausoleil, Redmond, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 37 days.

(21) Appl. No.: 14/353,995

(22) PCT Filed: Oct. 28, 2011

(86) PCT No.: PCT/US2011/058352
§ 371 (c)(1),
(2), (4) Date: Apr. 24, 2014

(87) PCT Pub. No.: WO2013/062584
PCT Pub. Date: May 2, 2013

(65) Prior Publication Data
US 2014/0264723 A1 Sep. 18, 2014

(51) Int. Cl.
*G02B 6/122* (2006.01)
*H01L 27/12* (2006.01)
*H01L 21/02* (2006.01)
*H01L 21/82* (2006.01)

(52) U.S. Cl.
CPC ......... *H01L 27/1203* (2013.01); *G02B 6/122* (2013.01); *H01L 21/02439* (2013.01); *H01L 21/02444* (2013.01); *H01L 21/02494* (2013.01); *H01L 21/02502* (2013.01); *H01L 21/02532* (2013.01); *H01L 21/02546* (2013.01); *H01L 21/8213* (2013.01); *H01L 27/12* (2013.01)

(58) Field of Classification Search
CPC ........ H01L 21/02444; H01L 21/02527; G02B 6/122
See application file for complete search history.

(56) References Cited

U.S. PATENT DOCUMENTS

| | | | |
|---|---|---|---|
| 5,131,963 A | 7/1992 | Ravi | |
| 5,683,939 A | 11/1997 | Schrantz et al. | |
| 7,244,963 B2 * | 7/2007 | Ravi | ...... H01L 21/84 257/69 |
| 7,842,134 B2 | 11/2010 | Whitehead et al. | |
| 7,846,767 B1 | 12/2010 | Sung | |

(Continued)

FOREIGN PATENT DOCUMENTS

| | | |
|---|---|---|
| EP | 0317124 | 5/1989 |
| GB | 2260342 | 4/1993 |

(Continued)

OTHER PUBLICATIONS

International Search Report and Written Opinion, international Application No. PCT/US2011/058352, Date of Mailing: Jul. 9, 2012, pp. 1-7.

(Continued)

*Primary Examiner* — Marc Armand
*Assistant Examiner* — Shannon Yi
(74) *Attorney, Agent, or Firm* — Hewlett Packard Enterprise Patent Department

(57) ABSTRACT

A device includes a substrate layer, a diamond layer, and a device layer. The device layer is patterned. The diamond layer is to conform to a pattern associated with the device layer.

15 Claims, 8 Drawing Sheets

(56) References Cited

U.S. PATENT DOCUMENTS

| | | | |
|---|---|---|---|
| 2003/0021515 A1* | 1/2003 | Brophy | G02B 6/12004 385/14 |
| 2004/0114853 A1* | 6/2004 | Bjorkman | G02B 6/12 385/14 |
| 2004/0191534 A1 | 9/2004 | Ravi | |
| 2006/0113545 A1 | 6/2006 | Weber et al. | |
| 2008/0063339 A1 | 3/2008 | Spillane et al. | |
| 2008/0096308 A1 | 4/2008 | Santori et al. | |
| 2008/0096309 A1 | 4/2008 | Sung | |
| 2009/0078943 A1 | 3/2009 | Ishida et al. | |
| 2009/0194773 A1 | 8/2009 | Hanson et al. | |
| 2011/0012199 A1 | 1/2011 | Nygaard et al. | |
| 2013/0256890 A1* | 10/2013 | Huang | H01L 21/76883 257/750 |

FOREIGN PATENT DOCUMENTS

| | | |
|---|---|---|
| TW | 200414309 A | 8/2004 |
| TW | 200609998 A | 3/2006 |

OTHER PUBLICATIONS

XP11485101A—IEEE Photonics Journal—Optimization of Hybrid Silicon Microring Lasers—vol. 3, No. 31 Jun. 2011.

* cited by examiner

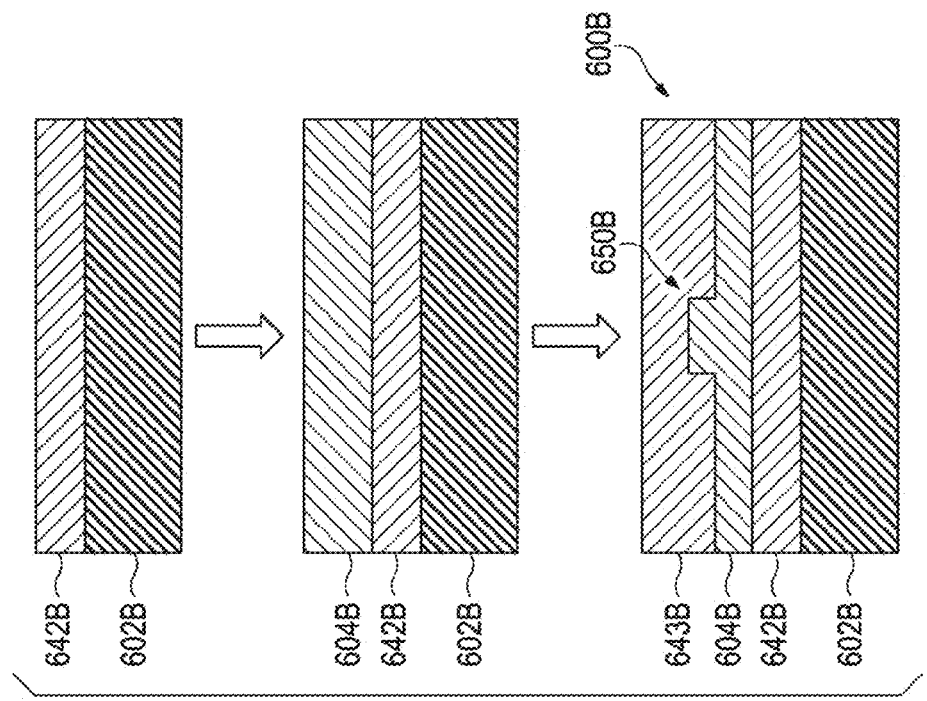
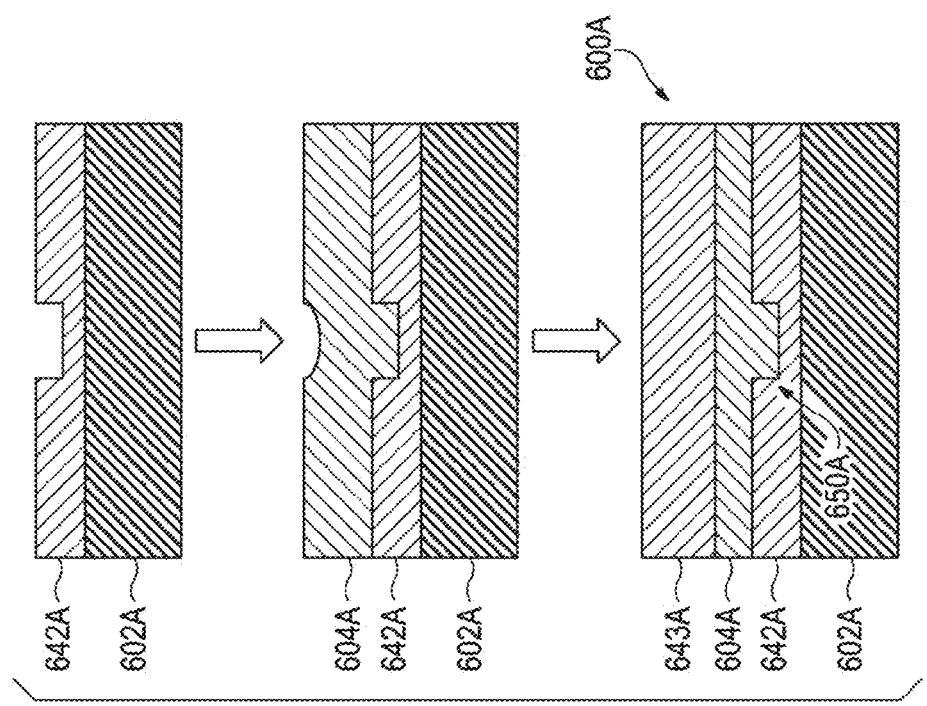

DEVICES INCLUDING A DIAMOND LAYER

BACKGROUND

Silicon (Si)-on-insulator (SOI) is a standard Si-based device platform, including an insulator layer that may be an oxide (i.e., a buried oxide (BOX) layer) such as $SiO_2$. However, $SiO_2$ has extremely poor thermal conductivity (approximately 1.3 W/m/degree C.), preventing efficient heat dissipation and causing device heating and degraded performance and/or reliability.

BRIEF DESCRIPTION OF THE DRAWINGS/FIGURES

FIG. 6A is a sectional side view of a device including a diamond layer according to an example.

FIG. 6B is a sectional side view of a device including a diamond layer according to an example.

The present examples will now be described with reference to the accompanying drawings. In the drawings, like reference numbers may indicate identical or functionally similar elements.

DETAILED DESCRIPTION

A device platform may include a diamond layer for enhanced performance. A silicon-on-diamond (SOD), or other semiconductor-on-diamond (e.g., gallium arsenide (GaAs)) device platform may be used for electronic and photonic devices, e.g., high-end microprocessors, laser light sources for optical interconnects, and other devices. The diamond layer may provide excellent heat dissipation capacity, and may provide thermal conductivity to transmit heat away from a device layer, for example.

Figure 1:
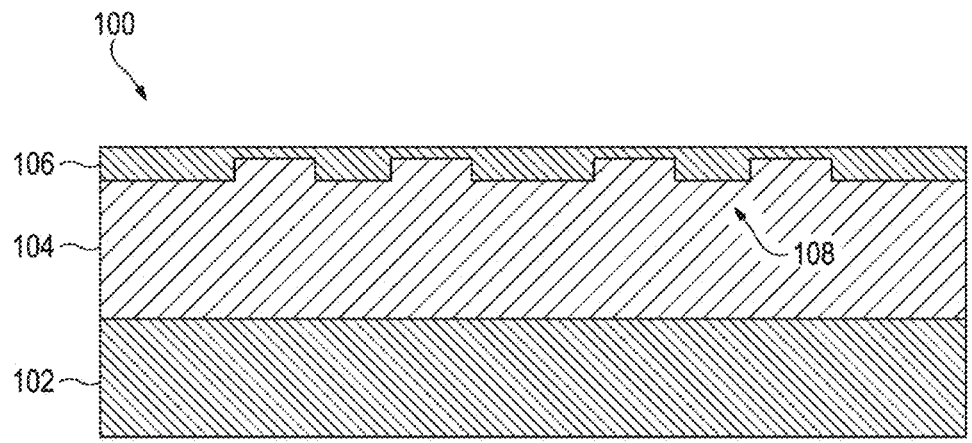
FIG. 1 is a sectional side view of a device including a diamond layer according to an example.

FIG. 1 is a sectional side view of a device 100 including a diamond layer 104 according to an example. The diamond layer 104 is coupled to a substrate layer 102 and a device layer 106. The device layer 106 may be a semiconductor such as silicon (Si), and may be obtained from a semiconductor wafer such as a bare Si substrate or SOI substrate, using Smart Cut™ or other techniques. The substrate layer 102 may be obtained as a handle substrate. The diamond layer 104 may be polished to couple substrate layer 102 to the diamond layer 104. In an example, the substrate layer 102 may be wafer bonded directly to the diamond layer 104.

The device layer 106 may be a semiconductor such as Si, gallium arsenide (GaAs), and the like, including materials to provide a high-index waveguide device. The device layer 106 may be obtained from a semiconductor wafer such as a bare Si substrate or SOI substrate. The device layer 106 may be obtained using Smart Cut™ or other techniques, including polishing away or otherwise removing portions of a source wafer.

The device layer 106 may include a patterned structure 108. For example, the patterned structure 108 may include device circuits, a waveguide, and/or other structures. At least a portion of the patterned structure 108 may extend downward into the diamond layer 104. The patterned structure 108 may be created by patterning/etching an underside of the device layer 106. In an example, the patterned structure 108 may be an optical device such as a waveguide and/or an electronic device such as device circuitry. The patterned structure 108 may include other features, including a silicon-on-insulator (SOI) encapsulated portion and/or a deposited metal layer, as the patterned structure 108 is not limited to blank silicon and may include different regions and different structures.

The diamond layer 104 may conform to the patterned structure 108 of the device layer 106. In an example, diamond may be blank deposited onto the patterned structure 108 using Chemical Vapor Deposition (CVD) or other processes, thereby conforming the diamond layer 104 to the various surfaces of the patterned structure 108. A conforming diamond layer 104 may fill an entire topography of the patterned structure 108 of the device layer 106, including sidewalls of the patterned structure 108.

The diamond layer 104 may include a single-crystal or polycrystalline structure. Single-crystal diamond has very high thermal conductivity, is costly, and difficult to obtain in large sizes, potentially limiting cost-effective sizes of a single-crystal diamond wafer and/or increasing costs for such diamond-based devices. Polycrystalline diamond (poly diamond) has lower thermal conductivity than single-crystal diamond, but is lower cost and easy to scale up.

The diamond layer 104 may provide thermal conductivity up to 2400 Watts per meter per degree Kelvin (W/m/K). The diamond layer 104 may be sandwiched by the device layer 106 and the substrate layer 102, to provide heat conduction for the device layer 106. Device heat, e.g., heat from the device layer 106, may dissipate quickly to the substrate layer 102 via the diamond layer 104.

An upper portion of device layer 106 may be obtained by selectively removing a portion of the device layer 106. In an example, device layer 106 may be formed from a SOI wafer, whereby a silicon portion and an oxide portion (e.g., a Buried Oxide (BOX) layer) may be removed from the SOI wafer to leave behind a layer of silicon for obtaining the device layer 106. Furthermore, the BOX layer of the source SOI wafer may be used as a masking layer prior to its removal. Alternatively, device layer 106 may be formed from a Si wafer by a "Smart-cut" technique which splits the device layer 106 from its mother Si wafer, so the mother Si wafer may be reused. An upper portion of device layer 106 may be prepared for coupling to, or already in a state to be coupled to, a component that may interact with the device layer 106.

Figure 2:
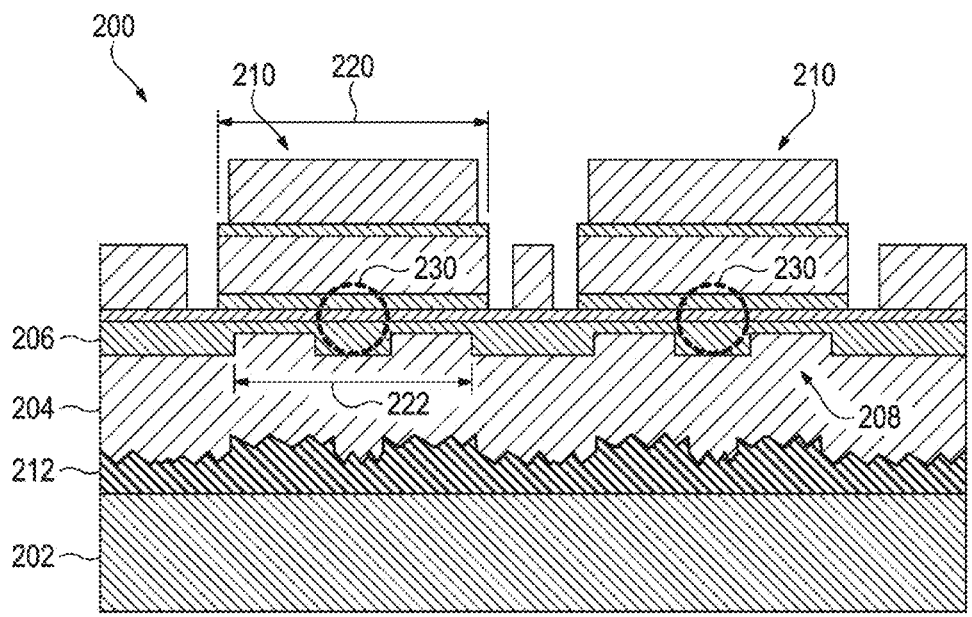
FIG. 2 is a sectional side view of a device including a plurality of components, an intermediate material layer, and a diamond layer according to an example.

FIG. 2 is a sectional side view of a device 200 including a plurality of components 210, an intermediate material layer 212, and a diamond layer 204 according to an example.

Device 200 may include a hybrid III-V on SOD device. A portion of component 210 may include group III-V layers, such as indium phosphate. Device 200 may include hybrid lasers and modulators with resonator geometries and hybrid photodetectors that may be used as an on-chip light source for photonic integrated circuits (PICs) including photonic data links, and may be used for wavelength division multiplexing (WDM), add-drop filters/routers, switches, sensors, modulators, buffers, and on-chip optical interconnect applications, passive components such as multiplexers and other waveguide components, and active components such as lasers, photodetectors, and modulators.

Patterned structure 208 associated with device layer 206 may be coupled to components 210, e.g., based on optical coupling, to provide an optical mode region 230. A waveguide lateral dimension 222 associated with the patterned structure 208 may provide waveguiding of a single lateral hybrid mode. A component lateral dimension 220 may be wider than the waveguide lateral dimension 222, as components 210 may be associated with concerns of fabrication tolerance and device series resistance. By creating a waveguide or other patterned structure 208 that is narrow, it is possible to achieve a single hybrid mode for operation of device 200, even though the component 210 (e.g., a III-V ring waveguide) has a component lateral dimension 220 that would otherwise be too wide for a single-mode regime.

More specifically, waveguide modes may depend on a width of the waveguide, and a waveguide may be a single mode waveguide or a multimode waveguide. Single mode may be associated with a narrow waveguide, so that its width is narrow enough to support the fundamental mode. However, a top portion/component 210 may be associated with increased width to address other considerations relating to the component 210. For example, a component lateral dimension 220 may facilitate alignment of the component 210 relative to the patterned structure 208, help avoid electrical issues of a too-narrow component 210 due to a quantum-well active region in the component 210 and the etched sidewall being too near the optical mode region 230, and other electrical performance issues such as electrical leakage. The patterned structure 208 may be provided independently of the component 210, e.g., by patterning the device layer 206 prior to deposition of diamond layer 204. Thus, for a SOD platform such as device 200, a lateral dimension 222 associated with a waveguide (or other patterned structure 208) may be narrower than the component lateral dimension 220. Thus, a hybrid optical mode region 230 may be affected by the waveguide lateral dimension 222 to provide the benefits of a single mode, without having to shrink the component 210 or incur associated size issues.

A wider component lateral dimension 220 may be beneficial in view of material resistance being proportional to the length of the material, and inversely proportional to the cross section area of the material. For component 210, charge carriers may be injected from a top region. If component lateral dimension 220 (e.g., ring length for a resonant ring) is wider, its cross section may be larger, and its resistance lower, reducing heat and further preserving single-mode operation.

An intermediate material layer 212 may be provided to couple the diamond layer 204 to the substrate layer 202. In an example, the intermediate material layer 212 may be deposited on diamond layer 204. The intermediate material layer 212 may be compatible with polishing, e.g., for enhancing bonding to other layers such as the substrate layer 202. The intermediate material layer 212 may include materials such as aluminum metal, copper metal, oxides of aluminum, oxides of beryllium, polysilicon, and other CMOS-compatible materials that may survive a CMOS fabricating environment, have good thermal conductivity, and may be easily polished (e.g., compatible with chemical-mechanical planarization or polishing (CMP)). More specifically, the intermediate material layer 212 may have a thermal conductivity higher than transparent insulators used in a CMOS environments, such as oxides ($SiO_2$), different types of glasses, crystals such as quartz (including amorphous crystals), and a broad class of insulators used for mirror substrates, for example. The intermediate material layer 212 may be formed as a very thin layer, and the intermediate material layer 212 may be omitted wherein the diamond layer 204 may be polished effectively for bonding to the substrate layer 202.

Figure 3:
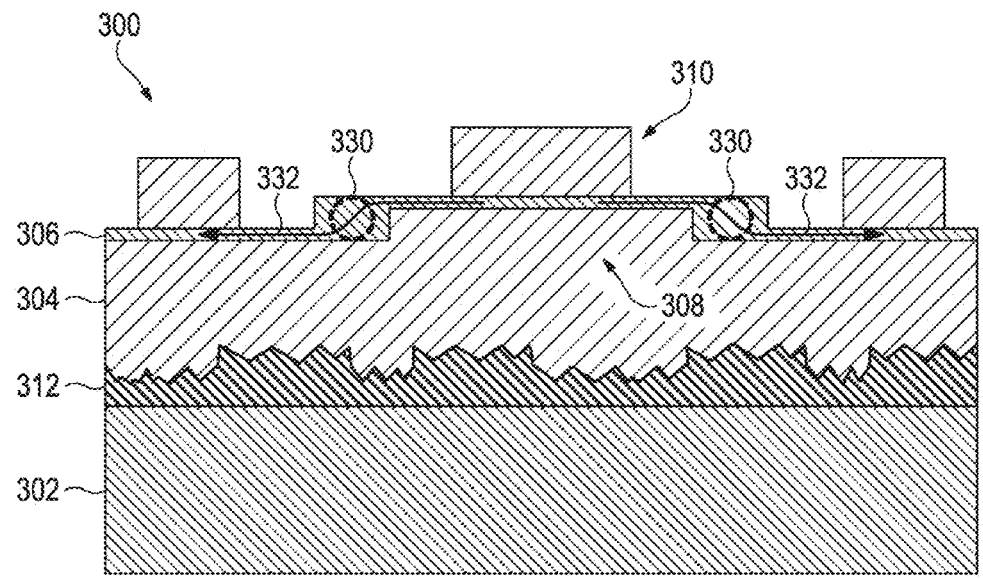
FIG. 3 is a sectional side view of a device including a diamond layer and an asymmetric device layer according to an example.

FIG. 3 is a sectional side view of a device 300 including a diamond layer 304 and an asymmetric device layer 306 according to an example. A substrate layer 302 is coupled to an intermediate material layer 312 that is coupled to the diamond layer 304 that conforms to the device layer 306. A component 310 is coupled to the device layer 306.

Component 310 and device layer 306 may function as a microring modulator, for example. An asymmetric device layer 306, such as a waveguide, may provide a particular structure wherein a lower portion of the patterned structure 308, e.g., a portion facing the diamond layer 304, differs from an upper portion coupled to the component 310. In examples where charge carriers are injected or depleted, e.g., to induce change in a modal index and loss for modulation, switching, or attenuation applications, the asymmetric structure of device layer 306 may be particularly favorable in view of a charge carrier path 332.

Charge carrier path 332 may provide enhanced overlap between charge carriers and the optical mode regions 330. For example, charge carriers may flow across a center of the optical mode region 330, by virtue of the asymmetry associated with the device layer 306 and the charge carrier path 332 in view of the location of the optical mode region 330. The device layer 306 may be structured from a wafer that is etched on both sides, for example, to provide the asymmetric properties without having to incrementally build up the device layer 306 on top of the diamond layer 304. Thus, obtaining the device layer 306 from a source wafer provides efficiencies in fabrication, yield, reliability, and other benefits.

Carriers interacting with an asymmetric waveguide device layer 306 may be induced to flow across the waveguide from one corner to another, interacting with the waveguide efficiently, which may include passing through a center of the optical mode region(s) 330. A thickness of the device layer 306 is not uniform, and may be greater than or less than a thickness of a waveguide. Thus, in contrast to a symmetric waveguide, the asymmetric device layer 306 may reduce or eliminate the likelihood that injected charge carriers will flow into or away from a waveguide in a way that they would avoid interacting with the entire area of the waveguide.

Figure 4:
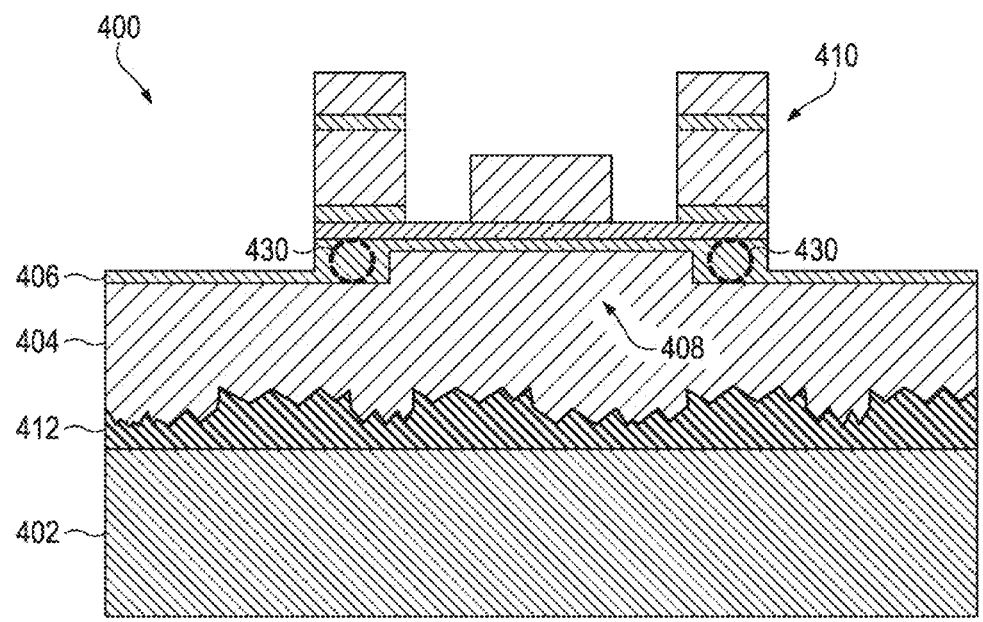
FIG. 4 is a sectional side view of a device including a diamond layer and an asymmetric device layer according to an example.

FIG. 4 is a sectional side view of a device 400 including a diamond layer 404 and an asymmetric device layer 406 according to an example. Substrate layer 402, intermediate material layer 412, diamond layer 404, device layer 406, and component 410 may be coupled together.

Component 410 may function in device 400 as a hybrid III-V on SOD microring laser, modulator or photodetector.

Heat dissipation from the device layer 406 through the diamond layer 404 (and through intermediate material layer 412 when included) to the substrate layer 402 may avoid heat-related issues such as resonance wavelength drifting in the microring device(s) associated with component 410.

Thus, an asymmetric device layer 406, such as an asymmetric waveguide, may be incorporated into a hybrid silicon microring laser, modulator or photodetector. A lateral dimension of the patterned structure 408 (e.g., waveguide) may provide a single lateral hybrid mode. It is possible to achieve a single hybrid mode for the microring waveguide structure even though the component 410 (e.g., a III-V ring waveguide) is still wider than what would otherwise potentially be limited to operation in a single-mode regime due to sizing.

Figure 5A:
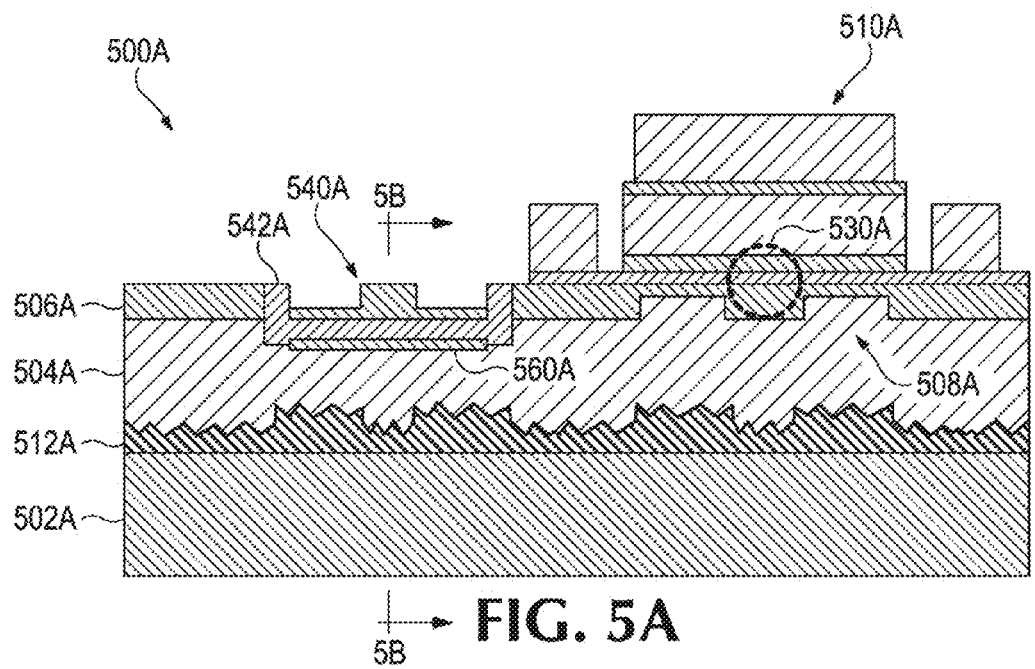
FIG. 5A is a sectional side view of a device including an insulated patterned structure and a diamond layer according to an example.

FIG. 5A is a sectional side view of a device 500A including an insulated patterned structure 540A and a diamond layer 504A according to an example. A substrate layer 502A is coupled to the diamond layer 504A via an intermediate material layer 512A. The diamond layer 504A is coupled to a device layer 506A. Component 510A is coupled to the device layer 506A and is associated with an optical mode region 530A. The device layer 506A is patterned with a patterned structure 508A and insulated patterned structure 540A. The diamond layer 504A conforms to the patterning of the device layer 506A, including conforming to the patterned structure 508A and the insulated patterned structure 540A.

Device 500A is a hybrid device, including regions associated with diamond (e.g., SOD) and regions associated with an insulator (e.g., SOI). The regions associated with diamond may dissipate device heat quickly to the substrate layer 502A. Some other devices/components, such as those used to make functional photonic integrated circuits, may not be associated with generating and/or suffering from device heating. Example devices/components with such characteristics may include passive waveguides and/or grating couplers. Other devices may use heat to tune their performances (e.g., filters, silicon modulators), and therefore may benefit from heating by avoiding the heat dissipation to the diamond layer 504A. Such devices, that are immune to heat and/or utilize thermal tuning, may be provided as the insulated patterned structure 540A so that injected external heat may influence those devices, rather than dissipating (wasting) away through the diamond layer 504A to the substrate layer 502A.

A dielectric 542A, such as a buried oxide, may provide a localized SOI region so that underlying diamond has little thermal and other effects on the insulated patterned structure 540A above the dielectric 542A. Thus, a versatile platform may be provided both with a SOD region (or other semiconductor on diamond region) for good thermal dissipation associated with the patterned structure 508A, as well as a localized SOI region (insulated patterned structure 540A) for devices with thermal tuning or thermal immunity. The versatile platform may meet different needs and may include photonic and electronic devices integrated on it.

Thermal oxidation may be used to provide the dielectric 542A. For example, a portion of the device layer 506A may be oxidized before formation of the patterned structure 508A, resulting in a SOI insulated patterned structure 540A on top of the diamond layer 504A. Alternatively, dielectric 542A can be formed by external dielectric deposition before formation of the patterned structure 508A. The insulated patterned structure 540A may be formed by selective encapsulation using an oxide dielectric, for example encapsulation of Si with $SiO_2$.

A SOI structure on top of a diamond substrate enables devices utilizing thermal tuning to efficiently absorb the heat without loss to the diamond layer 504A and substrate layer 502A. A combination SOI and SOD device, similar to device 500A, may provide freedom in device design to allow simultaneous existence of devices where heating is a negative and devices where heating is a positive and/or non-issue (wherein the insulated patterned structure 540A may provide a thermally isolated local environment). Devices associated with thermal tuning may include modulators, add-droppers, and other devices. Device 500A may include hybrid devices, such as hybrid Photonic Integrated Circuit (PIC) architectures, hybrid lasers, hybrid or Si photodetectors, hybrid or Si modulators, surface gratings, passive Si waveguide components, switches, and other devices, which may all be on the same chip. Devices with serious device heating may be associated with a SOD waveguide structure, such as patterned structure 508A. Devices utilizing thermal tuning (e.g., ring modulators, adder-droppers, etc.), and/or devices not suffering from device heating (e.g., surface grating couplers), may be provided as a localized insulated patterned structure 540A (e.g., SOI region) formed on top of the blank deposited diamond layer 504A.

The insulated patterned structure 540A may include a metal layer 560A. The metal layer 560A may be associated with regions where a surface grating is placed, i.e., beneath insulated patterned structure 540A. Metal layer 560A may be omitted. In an example, a passive waveguide region metal layer 560A may be omitted to avoid metal absorption of light.

The metal layer 560A may reflect light back to the surface in a surface grating coupler region (e.g., insulated patterned structure 540A). A portion of an oxide dielectric 542A may be removed to accommodate metal layer 560A. Diamond is not needed in those localized regions associated with the insulated patterned structure 540A (including those regions with a metal layer 560A). However, a portion of the diamond layer 504A in those localized regions does not need to be removed, thereby realizing efficient device fabrication.

Figure 5B:
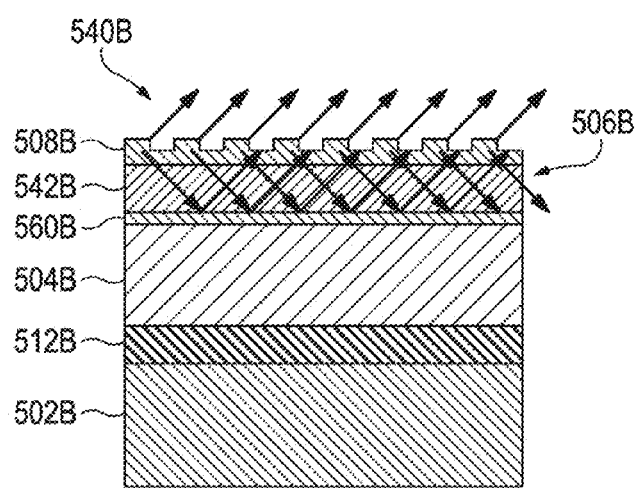
FIG. 5B is a sectional side view of a device including an insulated patterned structure and a diamond layer according to an example.

FIG. 5B is a sectional side view of a device including an insulated patterned structure 540B and a diamond layer 504B according to an example, based on a sectional side view of FIG. 5A as indicated in FIG. 5A. The insulated patterned structure 540B may be coupled to the diamond layer 504B, intermediate material layer 512B (may be included or omitted, as with other examples), and substrate layer 502B. The insulated patterned structure 540B may be part of device layer 506B, and may include metal layer 560B, dielectric 542B, and patterned structure 508B.

Incident light may pass through patterned structure 508B. Whether optical loss increases or decreases may depend on a thickness of the dielectric 542B between the patterned structure 508B and the metal layer 560B. In an example, if the dielectric is 1 μm or thicker, then absorption of light by the metal layer 560B may be negligible. If 508B includes a periodically patterned structure (e.g., grating), it may create a simultaneous light reflection upward and downward. In the case where upward reflection is preferred, the downward part may be reflected upward again by the metal layer 560B. The metal reflector may provide a high reflectivity to avoid wasting light originally reflected downwards. The dielectric may be thicker or thinner, and may be chosen in view of an index contrast between a material of the patterned structure 508B (e.g., silicon) and a material of the dielectric 542B (e.g., $SiO_2$). The thickness of the dielectric 542B is to provide a freedom to adjust a phase of the light reflection in dielectric 542B, so that originally reflected upward part and light bouncing back from the metal reflector may interfere constructively or destructively.

A light reflection coming from two parts may be out of phase or in phase, to enhance or cancel light in a direction. For example, phase cancellation may provide a type of isolation for portions of a device incorporating phase cancellation. By selecting appropriate initial thickness of dielectric 542B, a phase relationship may be adjusted between light reflected up by the grating 508B and incident light passing through the dielectric 542B going down and then forming a light reflection going up. For example, light reflection from the metal layer 560B may be in phase (e.g., constructive interference) with light reflecting off the grating 508B, which may drastically increase grating emission efficiency. Other phase relationships are possible, including constructive and/or destructive interference to affect grating emission efficiency. An interferometric device may use the insulated patterned structure 540B to provide relative phases of different paths that are specified to provide a particular phase/amplitude at the output of that device. A variety of different devices (e.g., interferometers) may be provided to provide phase adjustments (e.g., phase adjustments of 0 degrees, 90 degrees, 180 degrees, and so on), and interferometers/devices may include Mach Zehnder interferometers to determine the relative phase shift between two collimated beams from a coherent light source.

Figure 5C:
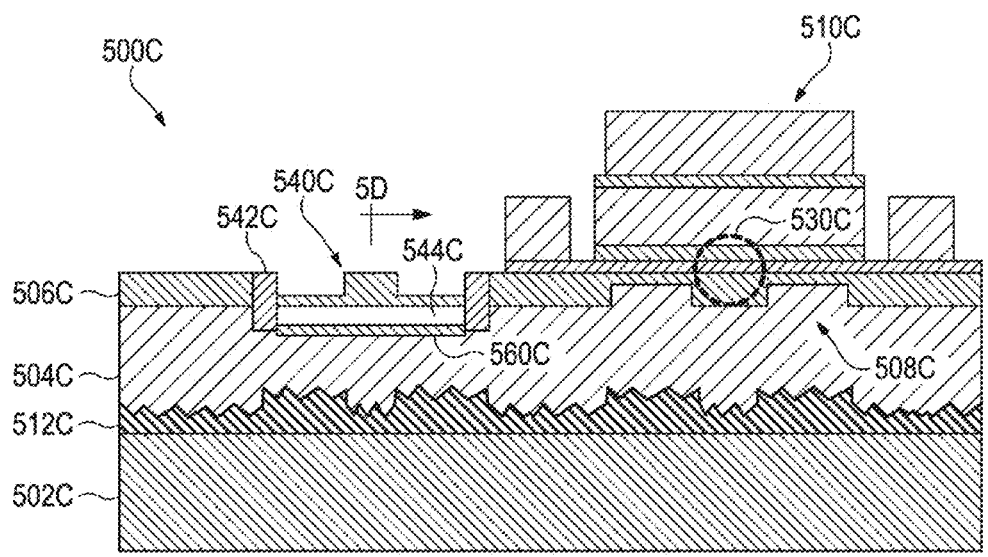
FIG. 5C is a sectional side view of a device including an insulated patterned structure and a diamond layer according to an example.

FIG. 5C is a sectional side view of a device 500C including an insulated patterned structure 540C and a diamond layer 504C according to an example. A substrate layer 502C may be coupled to the diamond layer 504C via an intermediate material layer 512C. The diamond layer 504C may be coupled to a device layer 506C. Component 510C may be coupled to the device layer 506C and may be associated with an optical mode region 530C. The device layer 506C may be patterned with a patterned structure 508C and the insulated patterned structure 540C. The diamond layer 504C may conform to the patterning of the device layer 506C, including conforming to the patterned structure 508C and the insulated patterned structure 540C.

Dielectric 542C of the insulated patterned structure 540C may include an air gap 544C, which may be provided by selectively removing at least a portion of dielectric 542C. Air gap 544C may be provided underneath the patterned portion of insulated patterned structure 540C. The air gap 544C may provide thermal isolation and waveguiding, so the initial oxide of the dielectric 542C used to create the air gap 544C may be thinner than in examples having an oxide dielectric 542C without an associated air gap 544C. For example, air gap 544C may be approximately 500 nm associated with light passage through air gap 544C, in contrast to thicknesses of 1-3 µm where light passage is through dielectric 542C.

Figure 5D:
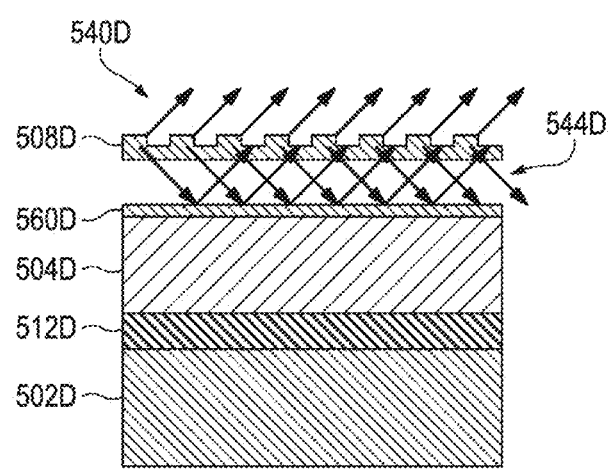
FIG. 5D is a sectional side view of a device including an insulated patterned structure and a diamond layer according to an example.

FIG. 5D is a sectional side view of a device including an insulated patterned structure 540D and a diamond layer 504D according to an example, based on a sectional side view of FIG. 5C as indicated in FIG. 5C. The insulated patterned structure 540D is coupled to the diamond layer 504D, intermediate material layer 512D (when included), and substrate layer 502D. The insulated patterned structure 540D may be part of a device layer, and may include a metal layer 560D, air gap 544D, and patterned structure 508D. The air gap 544D may provide additional options regarding optical performance (light reflection, constructive/destructive interference, etc.) and other performance criteria (e.g., thermal) compared to using another type of dielectric in place of the air gap 544D.

FIG. 6A is a sectional side view of a device 600A including a diamond layer 604A according to an example. Because the diamond layer 604A is to conform to patterned structures, the diamond layer 604A itself may provide waveguiding or other performance enhancing structures/features.

CVD diamond technology may be applied to form diamond-core waveguides (e.g., for quantum device applications), including formation of waveguides such as diamond slot, diamond rib, inverted diamond rib, diamond nanowire, inverted diamond nanowire, and stripe waveguides. In an example, dielectric 642A, e.g., a layer of $SiO_2$ (thermal of CVD), may be formed on a substrate layer 602A (e.g., a pure Si wafer). A trench may be etched in dielectric 642A. After blank depositing CVD diamond layer 604A onto the dielectric 642A, a surface of the diamond layer 604A may be polished. An upper dielectric 643A (e.g., another layer of $SiO_2$) may be deposited on the diamond layer 604A to act as the top cladding of the inverted diamond rib waveguide shown in FIG. 6A, which may also represent other waveguides including a diamond nanowire waveguide illustrated as 650A. Device 600A may be referred to as a SOD type II device, wherein a waveguide is formed such that a trench is filled by diamond and the diamond provides device functionality. Thus, the diamond waveguide may provide good heat extraction.

Waveguides described herein also may include stripe (i.e., channel) waveguides, which may represent an extreme of a rib waveguide, where a rib thickness approaches zero such that the core layer is practically removed in a region where no light is guided to propagate. A stripe waveguide also may be provided, having a triangular cross-section.

FIG. 6B is a sectional side view of a device 600B including a diamond layer 604B according to an example. A dielectric 642B is coupled to the substrate layer 602B. The diamond layer 604B is coupled to the dielectric 642B and then a waveguide structure is formed, and an upper dielectric 643B is coupled to the diamond layer 604B.

The diamond waveguide structures in FIGS. 6A and 6B may enable strong optical mode interaction with nitrogen vacancy centers inside the diamond layer(s), thereby enhancing the efficiency of optical quantum devices including diamond layer(s). Example processes may be used to provide such structures in a more efficient manner without a step for transferring Gallium Phosphide (GaP) thin film onto diamond to be waveguide core material.

Figure 7A:
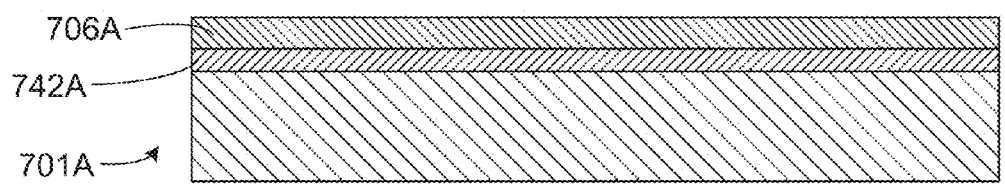
FIGS. 7A-7J are sectional side views of a method of fabrication of a device including a diamond layer according to an example.

FIGS. 7A-7J are sectional side views of a method of fabrication of a device including a diamond layer according to an example. In FIG. 7A, a silicon-on-insulator (SOI) substrate 701A is shown, although a wafer of blank silicon or other semiconductor may be used. The SOI substrate 701A may include a layer of dielectric 742A, separating the SOI substrate 701A into an upper layer of the substrate and a lower substrate portion. The upper layer of the substrate may be used as a device layer 706A. In the case of a wafer of blank material, blank ion implantation may be used to prepare the substrate 701A for later separation (e.g., using a Smart Cut™ or other process such as splitting and the like) based on an ion implantation layer (not shown).

Figure 7B:
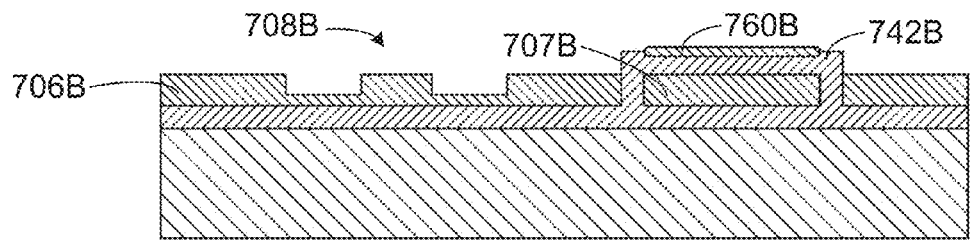

FIG. 7B shows device layer 706B including formation of patterned structure 708B, and formation of dielectric 742B to provide encapsulated device layer 707B. For example, patterned structure 708B may be a waveguide, and dielectric 742B may be provided based on thermal oxidation to encapsulate a portion of device layer 706B. A thickness of the dielectric 742B associated with the encapsulated device layer 707B may be varied, depending on desired optical characteristics and other factors. Metal layer 760B may be formed on top of the dielectric 742B as shown, to provide reflectance associated with the encapsulated device layer 707B. Metal layer 706B may be formed based on selective metal deposition. Metal layer 760B may be included, e.g., where surface grating will be placed, and may be omitted, e.g., where forming a passive waveguide region and preventing metal absorption of light. Thus, device fabrication may involve patterning a SOI wafer prior to applying further layers. Device layer 706B may be exposed to other patterning/techniques, including ion implantations to selectively affect portions of the device layer 706B including portions of patterned structure 708B and elsewhere. A second oxide encapsulation formation (not shown) may be formed on top of the metal layer 760B, thereby encapsulating the metal layer 760B. Encapsulating the metal layer 760B may prevent metal contamination of a diamond layer (e.g., CVD diamond reactor), and enable a wider variety of types of metal for the metal layer 760B including non-CMOS compatible metals (e.g., gold, silver) and metals with superior optical mirroring properties.

Figure 7C:
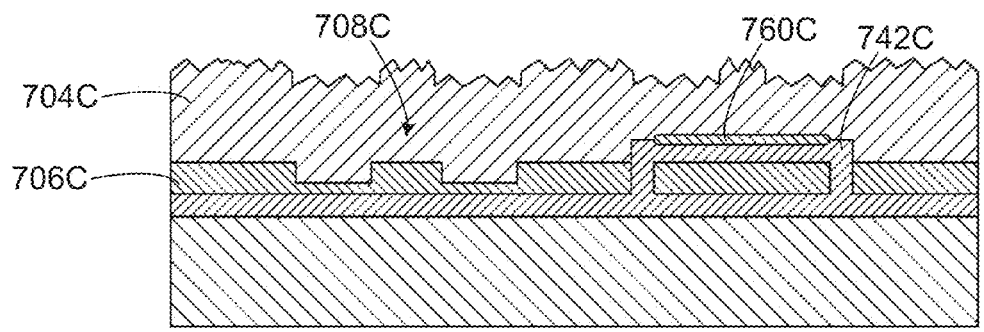

FIG. 7C shows formation of diamond layer 704C on top of the device layer 706C. The diamond layer 704C may be formed using CVD or other methods that enable the diamond layer 704C to conform to patterning of the device layer 706C, including conforming to patterned structure 708C, dielectric 742C, and/or metal layer 760C.

Figure 7D:
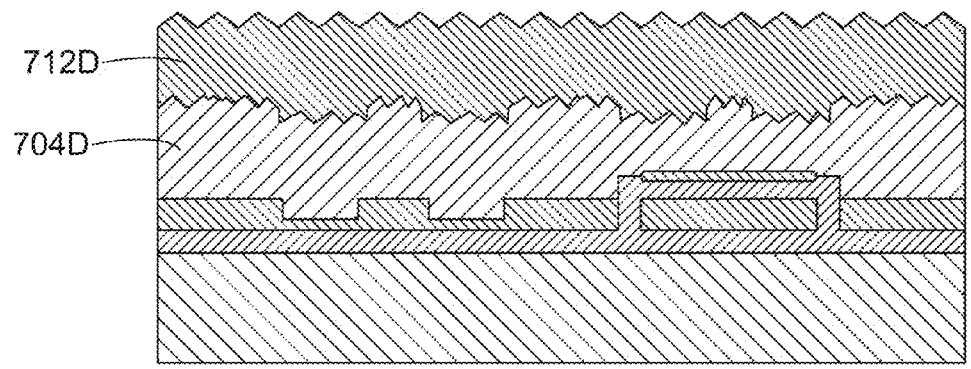

FIG. 7D shows formation of intermediate material layer 712D on top of diamond layer 704D. The intermediate material layer 712D may fill any irregularities in diamond layer 704D, and may be applied in a thin layer to avoid increasing thermal impedance. Alternatively, the diamond layer 704D may be polished smooth such that the intermediate material layer 712D may be omitted. The intermediate material layer 712D may have high thermal conductivity, may be compatible with CMOS processes, and may be readily polished to provide a bonding surface.

Figure 7E:
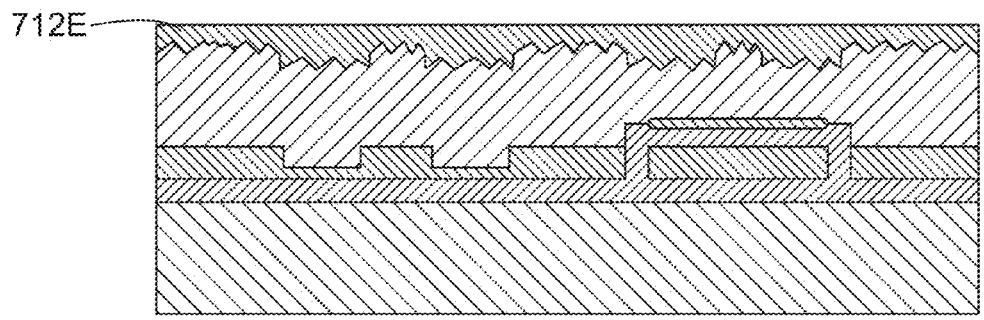

FIG. 7E shows polishing of the intermediate material layer 712E. The intermediate material layer 712E may be polished using CMP or other techniques. Accordingly, the intermediate material layer 712E is prepared for bonding and its thickness may be diminished to reduce thermal impedance and provide other benefits.

Figure 7F:
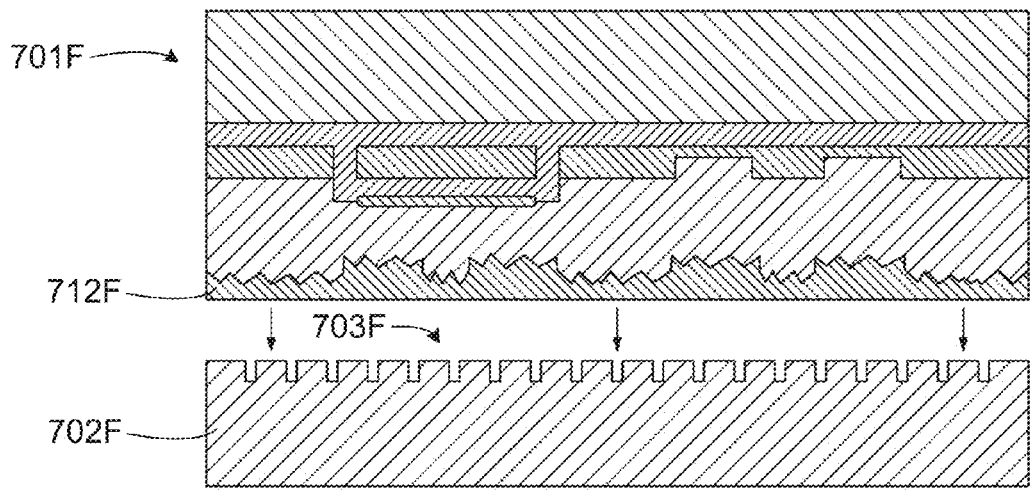

FIG. 7F shows bonding of the intermediate material layer 712F to a substrate layer 702F. The substrate layer 702 may be a silicon handle wafer, for example. The SOI substrate 701 has been inverted such that the intermediate material layer 712F is facing down. The substrate layer 702F may include substrate patterning 703F (e.g., a series of trenches or other patterning), although the substrate patterning 703F may be omitted in example devices, and may be used to provide additional optical and/or mechanical enhancements.

Figure 7G:
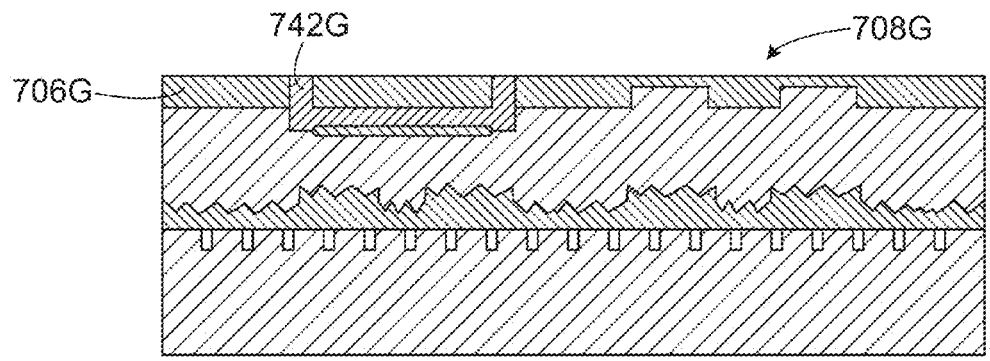

FIG. 7G shows removal of a portion of the SOI substrate, including removing the uppermost layer of silicon and dielectric, exposing the device layer 706G as an upper layer of the device platform. The layer may be removed based on Smart Cut™ or other techniques, e.g., by splitting at a blank ion implantation layer (not shown) of the substrate. Accordingly, the patterned structure 708G and dielectric 742G are positioned at the top of the device platform, with dielectric 742G encapsulating a portion of the device layer 706G.

Figure 7H:
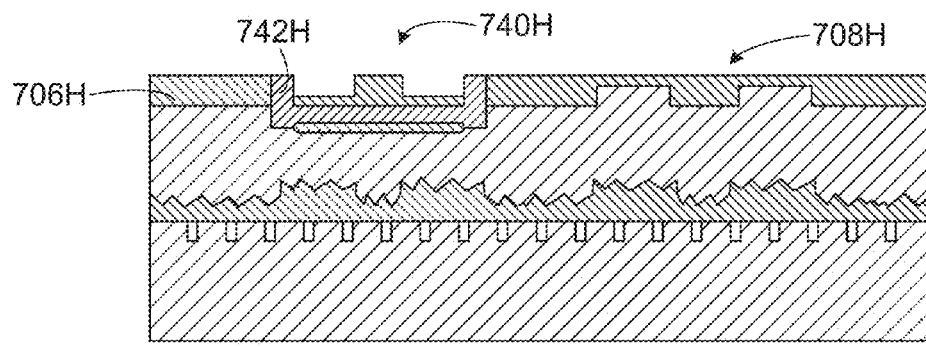

FIG. 7H shows patterning of the device layer 706H to form insulated patterned structure 740H encapsulated by dielectric 742G. Furthermore, though not specifically illustrated in FIG. 7H, a top surface of the device layer 706H is exposed for further patterning, including examples where an asymmetric patterned structure 708H is formed by patterning an upper portion differently than a lower portion. Device layer 706H may be exposed to other patterning/techniques, including ion implantations.

Figure 7I:
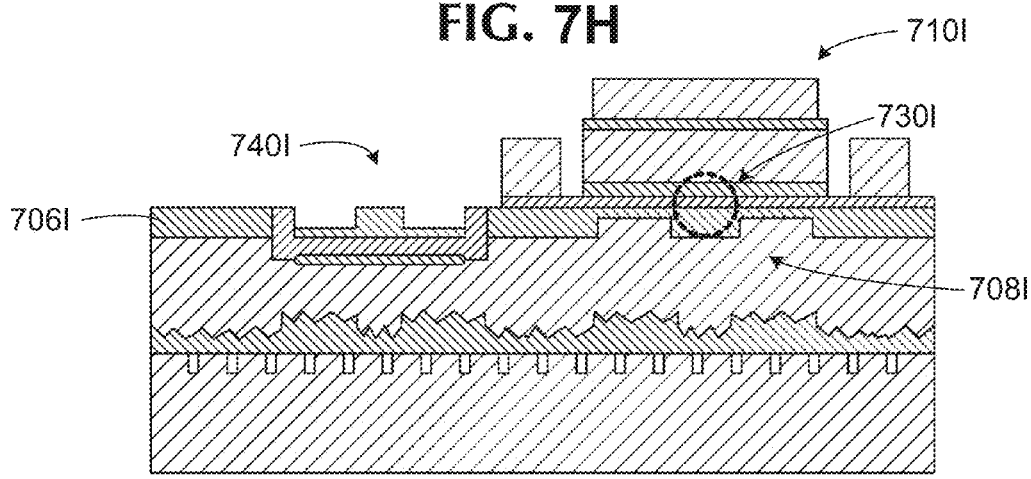

FIG. 7I shows component 710I coupled to the device layer 706I corresponding to patterned structure 708I. The component 710I may be wafer bonded to the device layer 706I. The component 710I also may be fabricated on the device layer 706I based on III-V epitaxial transfer of III-V layers onto the device layer 706I (e.g., hybrid integration of component layers with the device layer 706I). The component 710I is coupled to the device layer 706I to enable formation of an optical mode region 730I. Formation of component 710I may include electrode patterning. Accordingly, multiple components (e.g., insulated patterned structure 740I and component 710I) may be placed on the same device platform, including thermally insulated/insensitive/tuned and thermally generating devices. Formation of insulated patterned structure 740I may include formation of heater portions to affect a thermal environment of the insulated patterned structure 740I, e.g., encapsulating a top portion of the insulated patterned structure 740I with a cladding and forming a heater portion on the cladding.

Figure 7J:
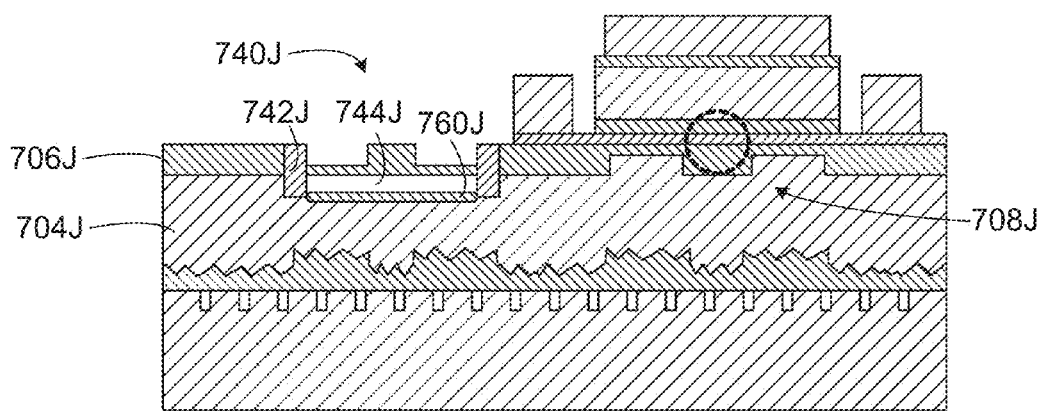

FIG. 7J shows insulated patterned structure 740J including an air gap 744J associated with the dielectric 742J. The air gap 744J may be formed by selectively etching the dielectric 742J, exposing the metal layer 760J. Furthermore, a thickness of the air gap 744J may be finely controlled based on the formation of the dielectric (e.g., see FIG. 7B), to provide tuned performance relating to the thickness of the air gap 744J. The diamond layer 704J may conform to the device layer 706J, the insulated patterned structure 740J including dielectric 742J/metal layer 760J, and patterned structure 708J. Based on the method of fabrication described above, various features may be embedded in the diamond layer 704J for enhanced thermal performance and other benefits.

The breadth and scope of the present invention should not be limited by any of the above-described examples, but should be defined in accordance with the following claims and their equivalents.

What is claimed is:

1. A device comprising:
    a substrate layer;
    a diamond layer coupled to the substrate layer; and
    a device layer, including a patterned structure and at least one unpatterned portion, the device layer separated from the substrate layer by the diamond layer, wherein the diamond layer is to conform to the patterned structure and the at least one unpatterned portion, and wherein the patterned structure forms at least a portion of a device on an underside of the device layer and is laterally sized to correspond to the device without extending laterally continuously across the substrate layer, and wherein the at least one unpatterned portion extends laterally from the patterned structure across the substrate layer.

2. The device of claim 1, wherein a top surface of the device layer is to be coupled with a component associated with the patterned structure to interact with the patterned structure.

3. The device of claim 1, wherein an upper portion of the patterned structure is asymmetrically patterned with respect to a lower portion of the patterned structure.

4. The device of claim 1, wherein the device layer includes an insulated patterned structure encapsulated by a dielectric.

5. The device of claim 4, wherein the insulated patterned structure of the device layer is associated with a component that is at least one of i) thermally tuned, ii) thermally insensitive, and iii) non-heat-generating.

6. A Silicon-On-Diamond (SOD) device comprising:
a substrate layer;
a diamond layer coupled to the substrate layer; and
a silicon device layer, patterned with a waveguide and including at least one unpatterned portion, the silicon device layer coupled to the diamond layer, wherein the diamond layer is to conform to the waveguide and the at least one unpatterned portion, and wherein the waveguide forms at least a portion of a device and is laterally sized to correspond to the device without extending laterally continuously across the substrate layer, and wherein the at least one unpatterned portion extends laterally from the patterned structure across the substrate layer.

7. The device of claim 6, wherein the diamond layer is coupled to the substrate layer via at least one intermediate material layer associated with a thermal conductivity greater than that of a transparent insulator.

8. The device of claim 6, wherein a top surface of the silicon device layer is patterned asymmetrically relative to a bottom surface of the silicon device layer, such that the waveguide is structured to provide a path for charge carriers associated with the waveguide to flow across a center of an optical mode region associated with the waveguide.

9. The device of claim 6, wherein the waveguide is associated with a single lateral hybrid mode and a component to be coupled with the waveguide, wherein a waveguide lateral dimension is narrower than a component lateral dimension.

10. The device of claim 6, wherein the diamond layer is to conform to the waveguide to form at least one of a diamond core waveguide, a diamond slot waveguide, a diamond rib waveguide, an inverted diamond rib waveguide, a diamond nanowire waveguide, an inverted diamond nanowire waveguide, and a stripe waveguide.

11. A device comprising:
a substrate layer;
a diamond layer coupled to the substrate layer;
a device layer, including a patterned structure and at least one unpatterned portion, the device layer separated from the substrate layer by the diamond layer, wherein the diamond layer is to conform to the patterned structure and the at least one unpatterned portion, and wherein the patterned structure forms at least a portion of a device, on an underside of the device layer, and wherein the patterned structure is laterally sized to correspond to the device without extending laterally continuously across the substrate layer, and wherein the at least one unpatterned portion extends laterally from the patterned structure across the substrate layer; and
an insulated patterned structure encapsulated by a dielectric and separated from the substrate layer by the diamond layer, wherein the diamond layer is to conform to the dielectric.

12. The device of claim 11, wherein the dielectric includes an air gap.

13. The device of claim 11, further comprising a metal reflector associated with the dielectric, wherein the diamond layer is to conform to the dielectric via the metal reflector.

14. The device of claim 11, wherein the device is a hybrid device including a Silicon on Diamond (SOD) portion associated with the device layer patterned structure and a Silicon on Insulator (SOI) portion associated with the insulated patterned structure, wherein the device is compatible with thermal tuning.

15. The device of claim 13, wherein the metal reflector is to provide a light reflection based on incident light passing through the dielectric, wherein the light reflection is associated with a specific phase relationship to the incident light based on a thickness of the dielectric.

* * * * *